US010043936B1

(12) United States Patent
O'Neill et al.

(10) Patent No.: US 10,043,936 B1
(45) Date of Patent: Aug. 7, 2018

(54) AVALANCHE DIODE, AND A PROCESS OF MANUFACTURING AN AVALANCHE DIODE

(71) Applicant: SensL Technologies Ltd., County Cork (IE)

(72) Inventors: Kevin Michael O'Neill, Co. Cork (IE); John Carlton Jackson, Co. Cork (IE); Liam Wall, Co. Cork (IE)

(73) Assignee: SEMICONDUCTOR COMPONENTS INDUSTRIES, LLC, Phoenix, AZ (US)

(*) Notice: Subject to any disclaimer, the term of this patent is extended or adjusted under 35 U.S.C. 154(b) by 0 days.

(21) Appl. No.: 15/336,368

(22) Filed: Oct. 27, 2016

(51) Int. Cl.
| | |
|---|---|
| *G11C 11/34* | (2006.01) |
| *G11C 11/36* | (2006.01) |
| *H01L 31/107* | (2006.01) |
| *H01L 31/0224* | (2006.01) |
| *H01L 31/028* | (2006.01) |
| *H01L 27/144* | (2006.01) |
| *H01L 31/0216* | (2014.01) |
| *H01L 31/02* | (2006.01) |
| *H01L 31/18* | (2006.01) |

(52) U.S. Cl.
CPC ........ *H01L 31/107* (2013.01); *H01L 27/1446* (2013.01); *H01L 31/028* (2013.01); *H01L 31/02027* (2013.01); *H01L 31/02161* (2013.01); *H01L 31/022408* (2013.01); *H01L 31/1804* (2013.01)

(58) Field of Classification Search
CPC .............. H01L 31/107; H01L 27/1446; H01L 31/02027; H01L 31/02161; H01L 31/022408; H01L 31/028; H01L 31/1804
USPC ......................................................... 365/175
See application file for complete search history.

(56) References Cited

U.S. PATENT DOCUMENTS

| | | | |
|---|---|---|---|
| 8,093,624 B1 * | 1/2012 | Renzi ................... H01L 31/107 257/186 |
| 2011/0079869 A1 * | 4/2011 | Mazzillo ........... H01L 27/14643 257/443 |
| 2011/0291103 A1 * | 12/2011 | Mazzillo ........... H01L 31/03529 257/76 |
| 2015/0340390 A1 * | 11/2015 | Wall ..................... H01L 27/1446 257/438 |
| 2016/0005913 A1 * | 1/2016 | O'Neill ............. H01L 31/02327 257/437 |
| 2016/0126381 A1 * | 5/2016 | Wang ................. H01L 31/03522 257/429 |
| 2016/0329369 A1 * | 11/2016 | Harmon ................. H01L 31/00 |

* cited by examiner

*Primary Examiner* — Ly D Pham
(74) *Attorney, Agent, or Firm* — Polansky & Associates, P.L.L.C.; Paul J. Polansky

(57) ABSTRACT

The present disclosure relates to an avalanche photodiode comprising a substrate having an active area. A first dopant implant in the active area forms one of an anode and the cathode of the avalanche photodiode. A second dopant implant in the active area forming the other one of the anode and the cathode of the avalanche photodiode, wherein at least one of the first and second dopant implants defines a discontinuous formation having at least one interruption.

42 Claims, 21 Drawing Sheets

AVALANCHE DIODE, AND A PROCESS OF MANUFACTURING AN AVALANCHE DIODE

FIELD OF THE INVENTION

The invention relates to avalanche photodiodes such as those which operate in linear avalanche mode or single photon counting Geiger mode. The present disclosure also relates to photon detectors. In particular, the present disclosure relates to high sensitivity photon detectors such as semiconductor photomultipliers. In particular, but not exclusively, the present disclosure relates to semiconductor photomultipliers (SiPMs or SPMs) in such areas as Positron Emission Tomography [PET], including Time-Of-Flight PET [TOF-PET], Laser Ranging [LIDAR] applications, bio luminescence, High Energy Physics [HEP] detectors.

BACKGROUND

SiPMs are semiconductor photon sensitive devices made up of an array of very small Geiger-mode avalanche photodiode (APD) cells on a substrate such as silicon. An example 10×10 microcell array is shown in FIG. 1 of the accompanying drawings. Each cell is connected to one another to form one larger device with one signal output. The entire device size can be as small as 1×1 mm or much larger. FIG. 2 of the accompanying drawings is a schematic diagram of an exemplary silicon photomultiplier.

APD cells vary in dimension from 10 to 100 microns depending on the mask used, and can have a density of up to 3000 microcells/sq. mm. Avalanche diodes can also be made from other semiconductors besides silicon, depending on the properties that are desirable. Silicon detects in the visible and near infrared range, with low multiplication noise (excess noise). Germanium (Ge) detects infrared to 1.7 µm wavelength, but has high multiplication noise. InGaAs (Indium Gallium Arsenide) detects to a maximum wavelength of 1.6 µm, and has less multiplication noise than Ge. InGaAs is generally used for the multiplication region of a heterostructure diode, is compatible with high speed telecommunications using optical fibres, and can reach speeds of greater than Gbit/s. Gallium nitride operates with UV light. HgCdTe (Mercury Cadmium Telluride) operates in the infrared, to a maximum wavelength of about 14 requires cooling to reduce dark currents, and can achieve a very low level of excess noise.

Silicon avalanche diodes can function with breakdown voltages of 20 to 500V, typically. APDs exhibit internal current gain effect of about 100-1000 due to impact ionization, or avalanche effect, when a high reverse bias voltage is applied (approximately 20-200 V in silicon, depending on the doping profile in the junction). Silicon Photomultipliers or SiPMs can achieve a gain of $10^5$ to $10^6$ by using Geiger mode APDs which operate with a reverse voltage that is greater than the breakdown voltage, and by maintaining the dark count event rate at a sufficiently low level. The current generated by an avalanche event must be quenched by an appropriate current limited scheme so that the device can recover and reset after an avalanche event.

In existing avalanche diodes light interacts with a silicon lattice to generate electron hole pairs which cause breakdown at a junction where there is a peak electric field. In the Geiger mode, there is a high applied bias that accelerates the electrons and holes causing impact ionisation and avalanche breakdown. It is desired that this effect only occur by electrons and holes initiated by photons. However, minority carrier current exists which cause spurious counts, known as the dark count, in the absence of light. This is undesireable. There is therefore a need for an avalanche photodiode and a process of manufacturing an avalanche photodiode which addresses at least some of the drawbacks of the prior art.

SUMMARY

The present disclosure relates to an avalanche photodiode comprising: a substrate having an active area; a first dopant implant in the active area forming one of an anode and the cathode of the avalanche photodiode; and a second dopant implant in the active area forming the other one of the anode and the cathode of the avalanche photodiode, wherein at least one of the first and second dopant implants defines a discontinuous formation having at least one interruption.

In one aspect, the other one of the first and second dopant implants defines a continuous formation.

In another aspect, the avalanche photodiode is a single photon avalanche diode (SPAD) or a Geiger mode avalanche photodiode In a further aspect, the discontinuous formation comprises at least two regions which are spatially separated from each other.

In an exemplary aspect, the avalanche photodiode further comprises one or more non-active regions.

In a further aspect, a space between the at least two regions generates lateral electric fields which forces minority carriers to the non-active regions thereby reducing noise caused by minority carriers.

In another aspect, a space at a border of a micro-cell boundary containing an array of avalanche photodiodes generates lateral electric fields which forces minority carriers to the non-active regions thereby reducing noise caused by minority carriers.

In one aspect, the discontinuous formation in the active region in use generates lateral electric fields which forces minority carriers to the non-active regions thereby reducing noise caused by minority carriers.

In another aspect, at least two regions together form one of the cathode and the anode of the avalanche diode.

In an exemplary aspect, the at least two regions are formed by a deep implant. Advantageously, the deep implant has a depth of between 500 nm and 8 microns. In one exemplary arrangement, the deep implant is a retrograde implant.

In a further aspect, one of the first and second dopant implant defines the continuous formation and is formed by a shallow dopant implant. Advantageously, the shallow dopant implant has a depth of between 10 nm and less than 500 nm.

In one aspect, the width of each region is in the range of 8 microns to 12 microns. Advantageously, the width of each region is approximately 10 microns.

In another aspect, the interruption is provided between each spaced apart region.

In one aspect, the interruption is located at a distance in the range of 8 microns to 16 microns from a micro-cell boundary.

In a further aspect, the interruption is located at 14 microns from the micro-cell boundary.

In one aspect, the number of spaced apart regions used to form one of the cathode and the anode of the avalanche photodiode is in the range of between 2 to 8 regions.

In another aspect, three spaced apart regions are provided. In an alternative aspect, four spaced apart regions are provided.

In one aspect, an optimal width of the interruption between adjacent spaced apart regions is determined by the depth of the implant and a dopant concentration of an epitaxial layer before the first and second dopant implants are implanted.

In an exemplary aspect, the width of the interruption is proportional to the depth of the implant.

In a further exemplary aspect, the optimal width of the interruption between adjacent spaced apart regions is 1.4 µm for an implant depth of 800 nm and a dopant concentration of the epitaxial layer of between $10^{14}$ and $10^{15}$ atoms/cm$^3$ prior to the first and second dopant implants being implanted.

In one aspect, the optimal width of the interruption between adjacent spaced apart regions is 2.8 µm for an implant depth of 1600 nm and a dopant concentration of the epitaxial layer of between $10^{14}$ and $10^{15}$ atoms/cm$^3$ prior to the first and second dopant implants being implanted.

In a further aspect, the optimal width of the interruption between adjacent spaced apart regions is 4.2 µm for an implant depth of 2400 nm and a dopant concentration of the epitaxial layer of between $10^{14}$ and $10^{15}$ atoms/cm$^3$ prior to the first and second dopant implants being implanted.

In another aspect, the substrate is one of an n-type substrate and a p-type substrate.

In a further aspect, an insulating layer is provided through which the first and second dopants are implanted.

In another aspect, an epitaxial layer is provided intermediate the insulating layer and the substrate.

In one aspect, the insulating layer is formed directly on the epitaxial layer. Advantageously, the epitaxial layer comprises a PN junction.

In another aspect, the substrate is highly doped for providing a low resistivity bulk region.

In a further aspect, the insulating layer comprises an oxide material,

In an exemplary aspect, an anti-reflective coating is provided on the insulating layer.

In one aspect, an optical pathway is provided for facilitating the transmission of light to the active region through the insulating layer.

In another aspect, the optical pathway is formed by etching a trench into a dielectric layer.

In an exemplary aspect, a quench resistor is operably coupled to the avalanche photodiode.

In another aspect, one of the first dopant implant and the second dopant implant is a P type material, and the other one of the first dopant implant and the second dopant implant is an N type material.

In a further aspect, the insulating layer has a thickness in the range of 10 nm to 50 nm.

In one aspect, the insulating layer comprises silicon nitride.

In another aspect, the anti-reflective coating comprises silicon oxide. Advantageously, the anti-reflective coating has a thickness in the range of 10 nm to 50 nm.

In a further aspect, the anti-reflective coating comprises SiO with a thickness of 36 nm and SiN with a thickness in the range of 10 nm-45 nm.

The present disclosure also relates to a semiconductor photomultiplier comprising a plurality of avalanche photodiodes; the respective avalanche diodes comprise: a substrate having an active area; a first dopant implant in the active area forming one of an anode and the cathode of the avalanche photodiode; and a second dopant implant in the active area forming the other one of the anode and the cathode of the avalanche photodiode, wherein at least one of the first and second dopant implants defines a discontinuous formation having at least one interruption.

These and other features will be better understood with reference to the followings Figures which are provided to assist in an understanding of the present teaching.

BRIEF DESCRIPTION OF THE DRAWINGS

The present teaching will now be described with reference to the accompanying drawings in which.

DETAILED DESCRIPTION

Figure 1:
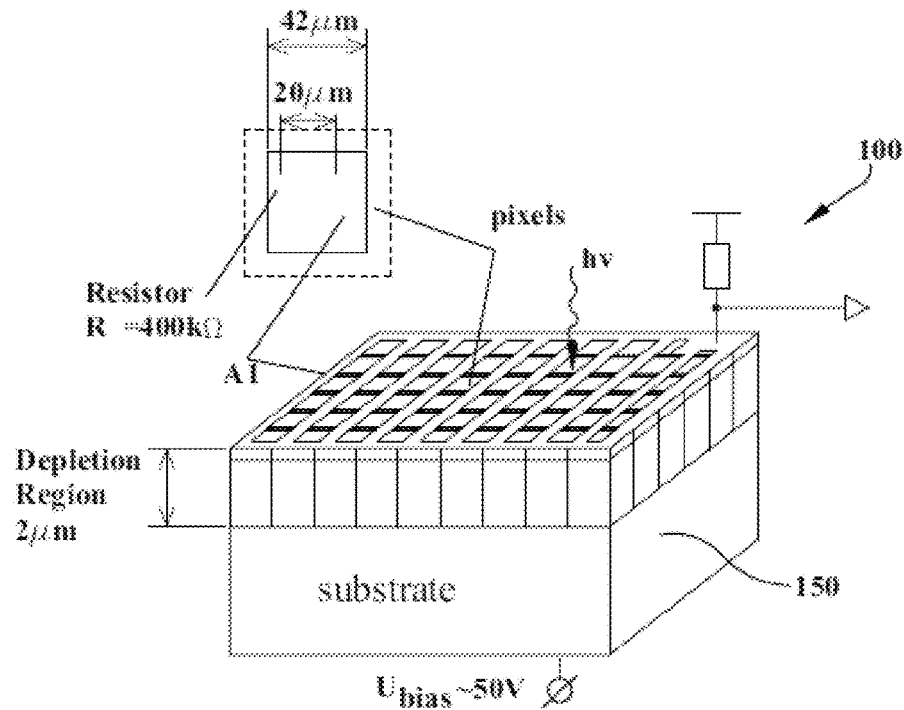
FIG. 1 illustrates an exemplary structure of a silicon photomultiplier.

The present disclosure will now be described with reference to some exemplary avalanche photodiodes. It will be understood that the exemplary avalanche photodiodes are provided to assist in an understanding of the teaching and is not to be construed as limiting in any fashion. Furthermore, circuit elements or components that are described with reference to any one Figure may be interchanged with those of other Figures or other equivalent circuit elements without departing from the spirit of the present teaching. It will be appreciated that for simplicity and clarity of illustration, where considered appropriate, reference numerals may be repeated among the figures to indicate corresponding or analogous elements.

Figure 2:
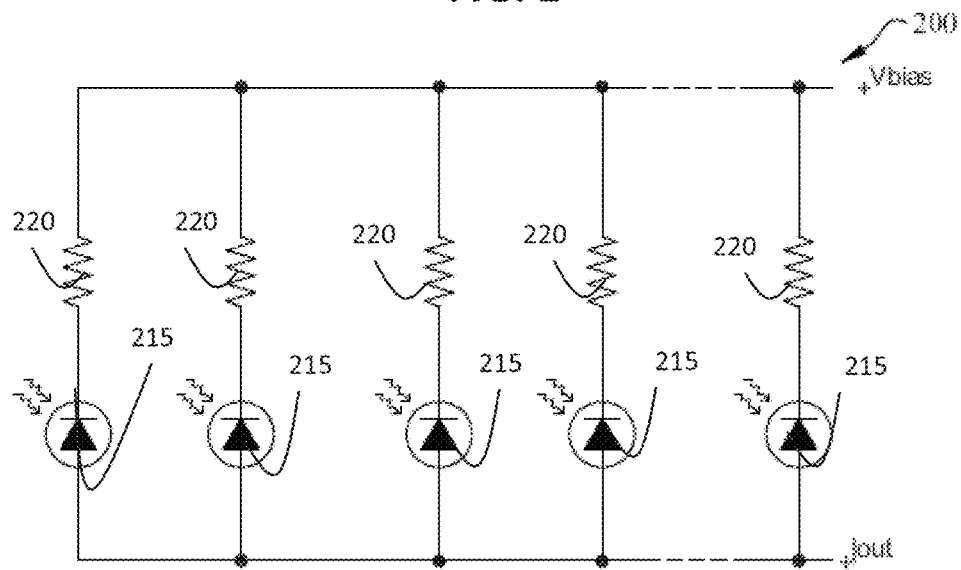
FIG. 2 is a schematic circuit diagram of an exemplary silicon photomultiplier.

Referring initially to FIG. 1, a silicon photomultiplier 100 comprising an array of Geiger mode avalanche photodiodes is shown. As illustrated, a quench resistor is provided adjacent to each photodiode which may be used to limit the avalanche current. The photodiodes are electrically connected to common biasing and ground electrodes by aluminium or similar conductive tracking. A circuit schematic is shown in FIG. 2 for an exemplary silicon photomultiplier 200 in which the anodes of an array of photodiodes are connected to a common ground electrode and the cathodes of the array are connected via current limiting resistors to a common bias electrode for applying a bias voltage across the diodes.

The silicon photomultiplier 100 integrates a dense array of small, electrically and optically isolated Geigermode photodiodes 215. Each photodiode 215 is coupled in series to a quench resistor 220. Each photodiode 215 is referred to as a microcell. The number of microcells typically number between 100 and 3000 per mm². The signals of all microcells are then summed to form the output of the SiPM 100. Each microcell detects photons identically and independently. The sum of the discharge currents from each of these individual binary detectors combines to form a quasi-analog output, and is thus capable of giving information on the magnitude of an incident photon flux.

Each microcell generates a highly uniform and quantized amount of charge every time the microcell undergoes a Geiger breakdown. The gain of a microcell (and hence the detector) is defined as the ratio of the output charge to the charge on an electron. The output charge can be calculated from the over-voltage and the microcell capacitance.

$$G = \frac{C \cdot \Delta V}{q}$$

Where:
  G is the gain of the microcell;
  C is the capacitance of the microcell;
  $\Delta V$ is the over-voltage; and
  q is the charge of an electron.

The present disclosure describes a method of manufacturing an avalanche photodiode which may be used in a silicon photomultiplier 100. The array of photodiodes 215 are formed on a semiconductor substrate 150 using semiconductor processes which will be known to one skilled in the art and may include for example, but not limited to, deposition, implantation, diffusion, patterning, doping, and etching. Patterned layers of conducting material, insulating material and doped areas of semiconductor form the structure of the photodiode.

Figure 3:
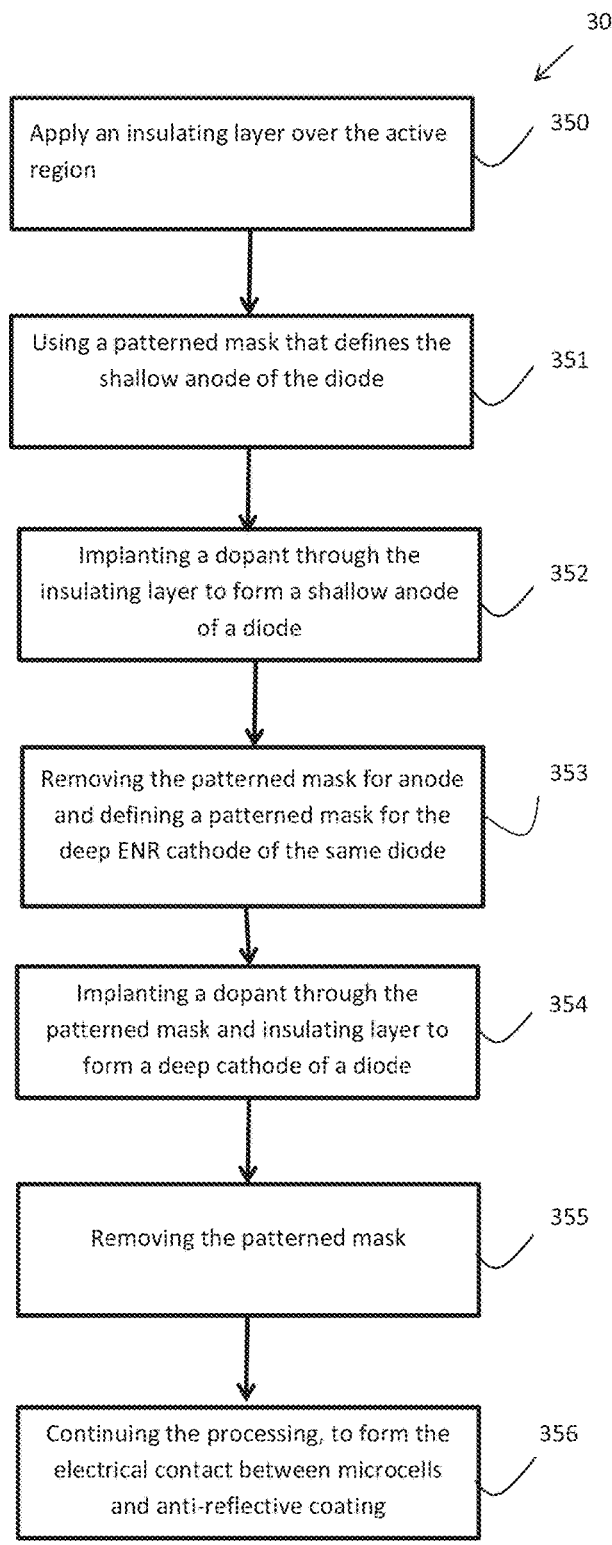
FIG. 3 is a flow chart illustrating exemplary steps for manufacturing a semiconductor photomultiplier.
Figure 4A:
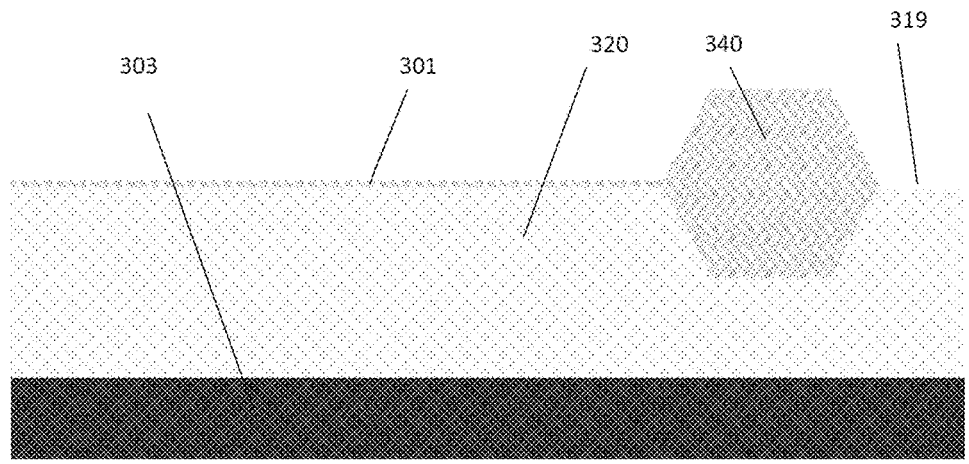
FIGS. 4A-4J are cross sectional views of a silicon photomultiplier which is fabricated using the method of FIG. 3.
Figure 4B:
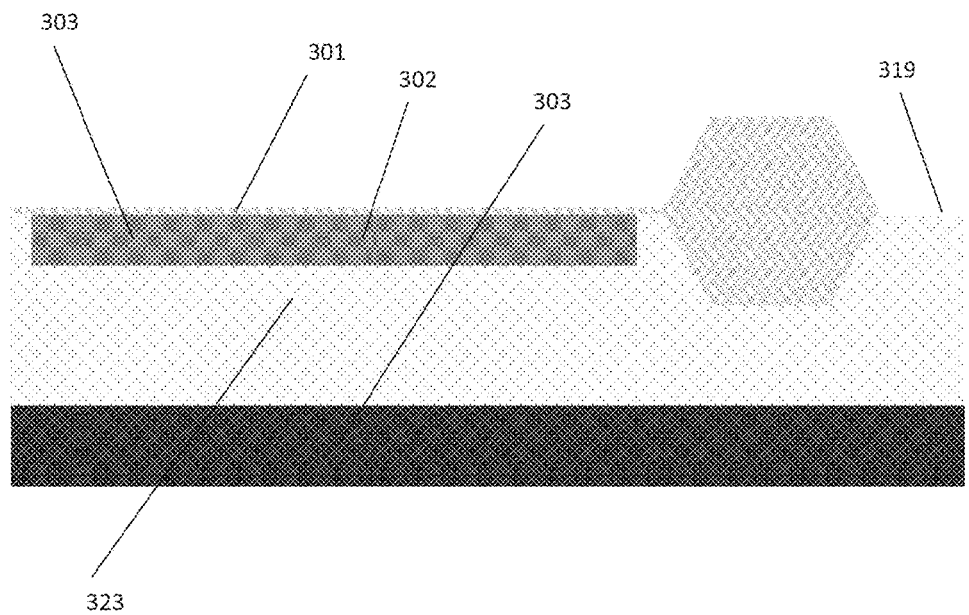
Figure 4C:
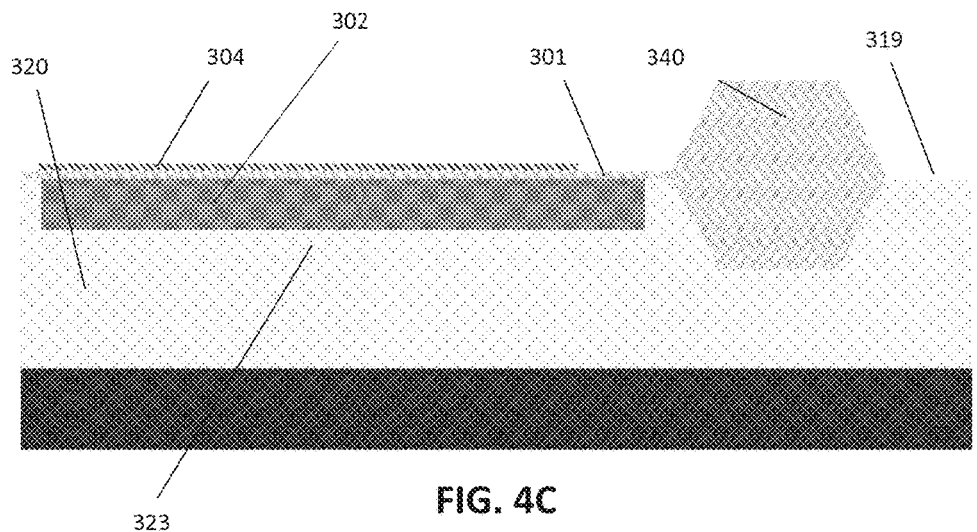
Figure 4D:
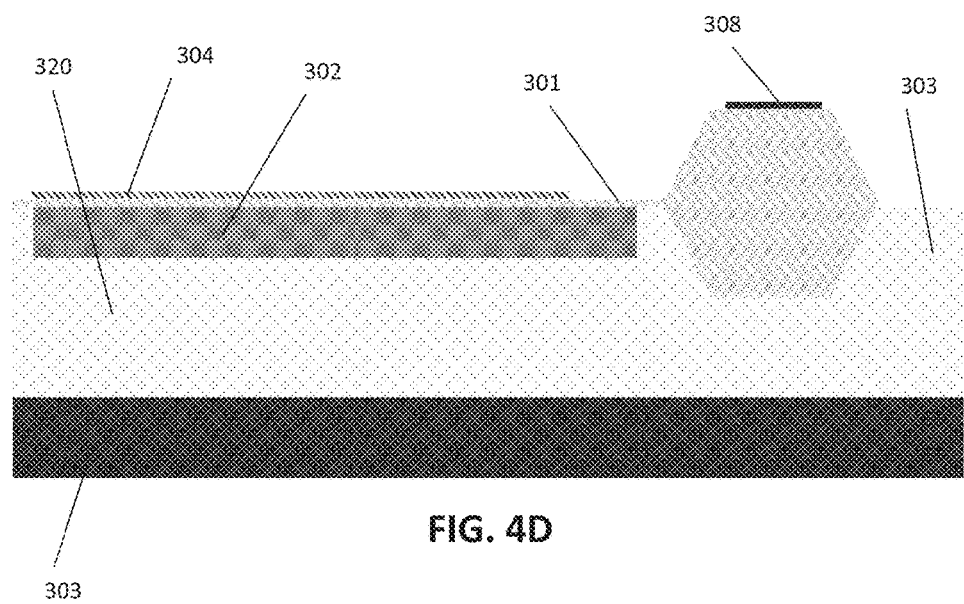
Figure 4E:
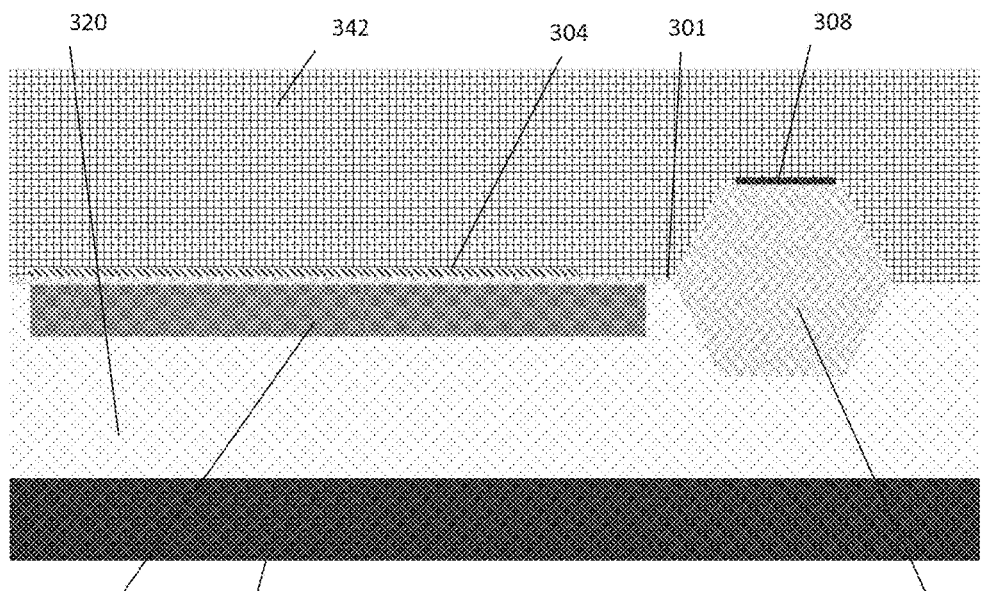
Figure 4F:
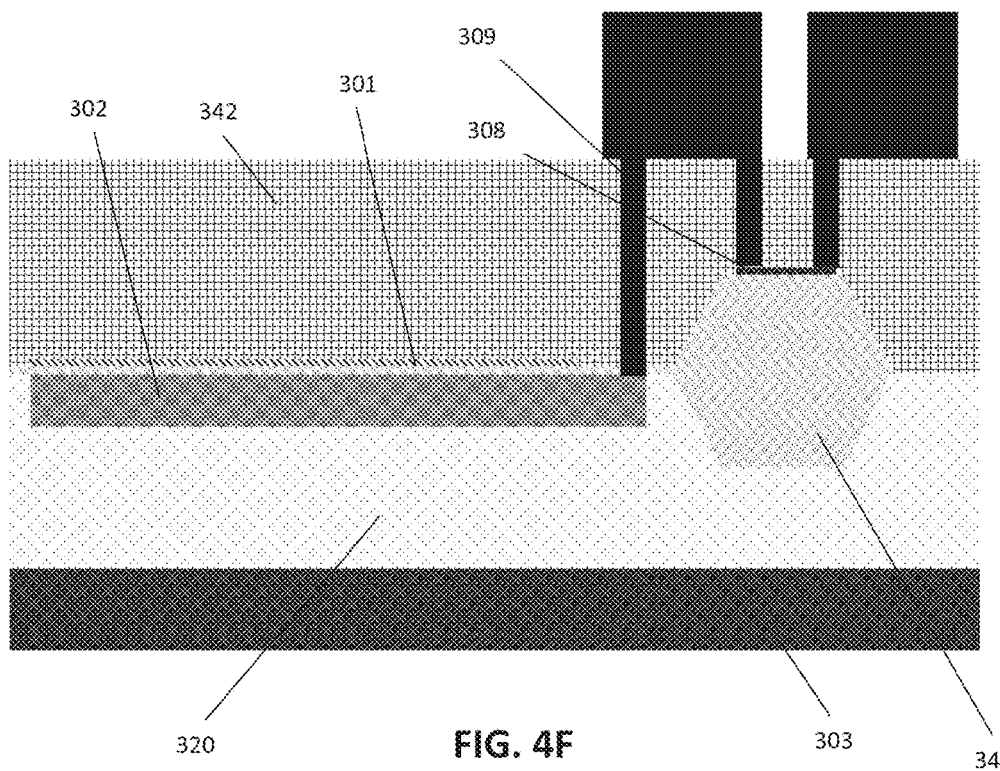
Figure 4G:
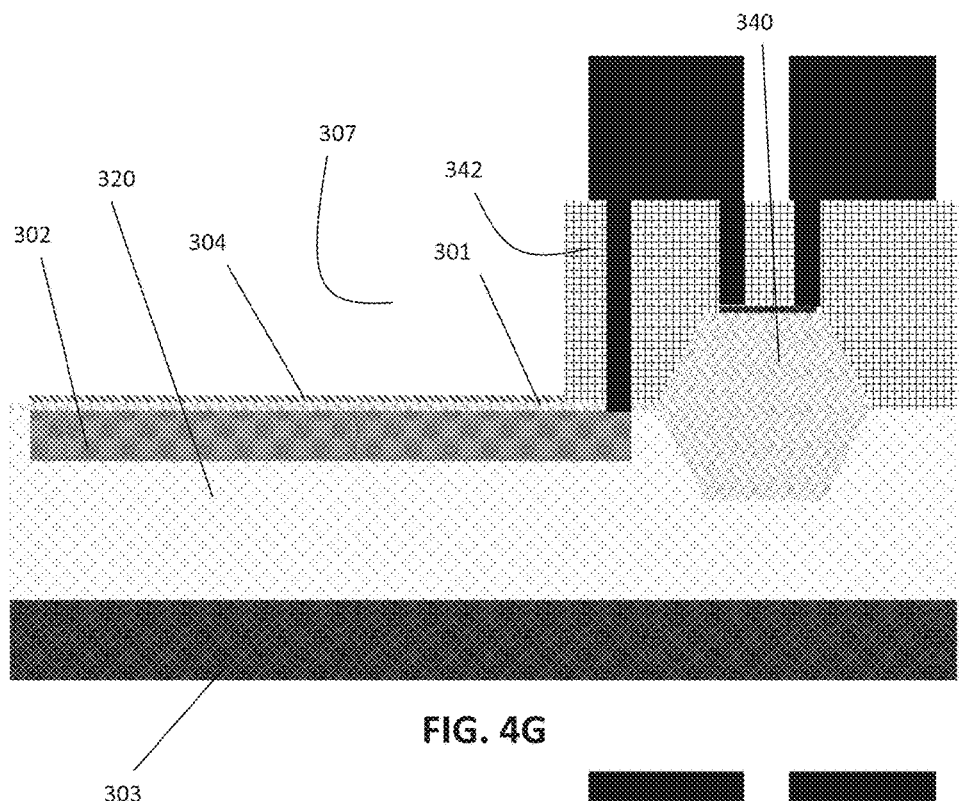
Figure 4H:
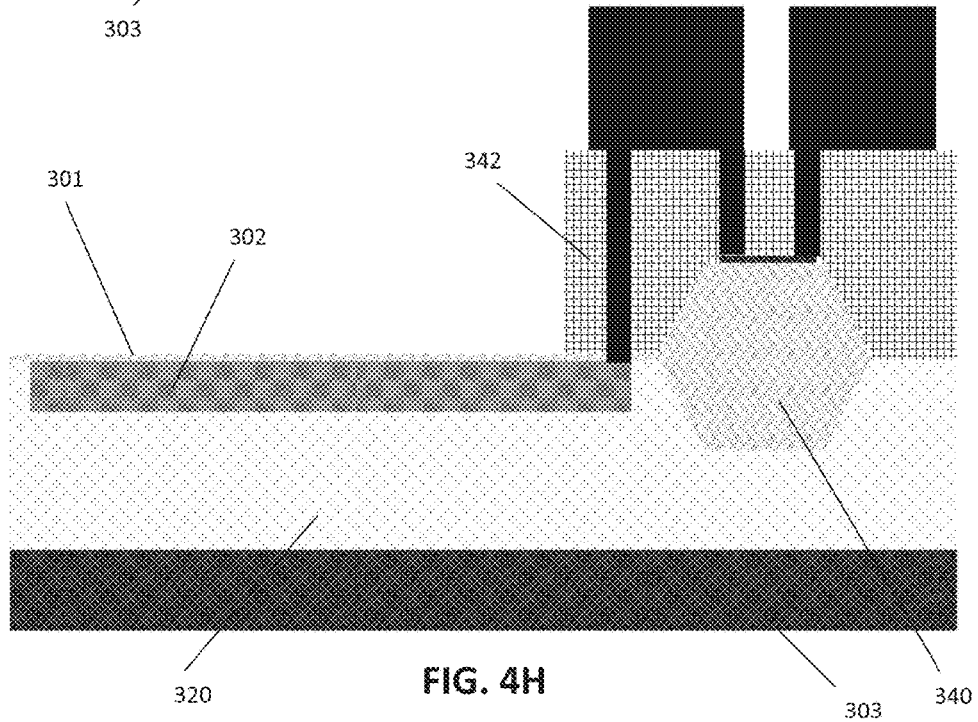
Figure 4I:
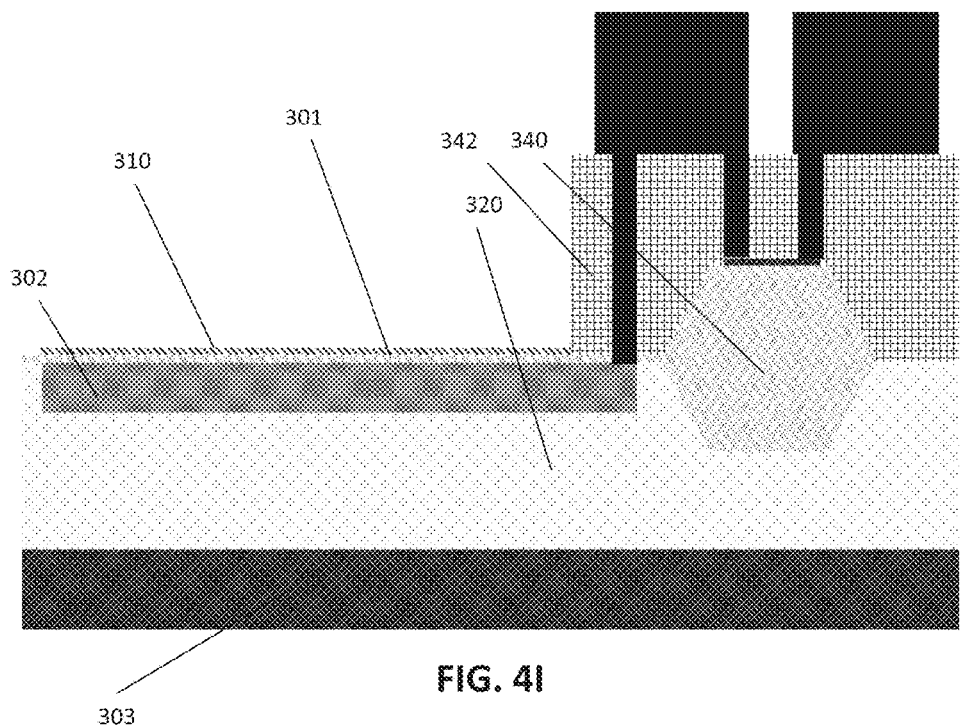
Figure 4J:
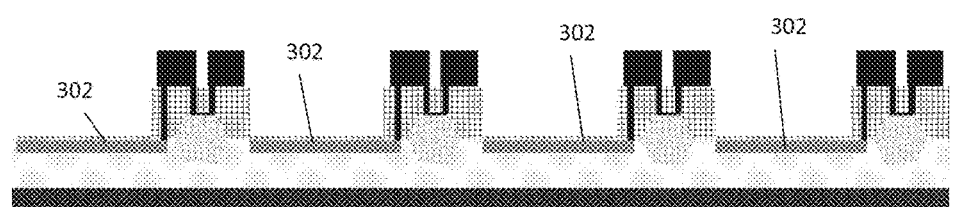

Referring to FIGS. 3 and 4I-4I there is illustrated an exemplary method for manufacturing an avalanche photodiode. An insulating layer 301 is formed over an active region 302 of a substrate 319, step 350. The insulating layer 301 is provided to prevent co-sputtering of metal ions from the surface to the active region 302, and to randomize the momentum of the incoming ions, which otherwise may penetrate deep into the silicon through channeling. In the exemplary arrangement, the substrate 319 comprises a highly conductive substrate region 303 with a low doped epitaxial layer 320 provided thereon. The insulating layer 301 is typically 10 nm-80 nm in thickness. The insulating layer 301 once formed may be retained over the active region throughout the manufacturing process to reduce the risk of damaging the active region 302. Alternatively, the insulating layer 301 may be removed. A patterned mask defines a shallow anode of the photodiode, step 351. A dopant is implanted through the insulating layer to form the shallow anode of photodiode, step 352. The patterned mask is removed for the anode and a second patterned mask is provided to define a deep ENR cathode of the photodiode, step 353. A dopant is implanted through the second patterned mask and the insulating layer to form a deep cathode of the photodiode, step 354. The second patterned mask is removed, step 355. Electrical contact between microcells and the anti-reflective coating are formed, step 356.

Figure 5A:
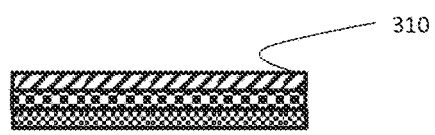
FIG. 5A is a cross sectional view of an anti-reflective coating comprising three distinct layers.
Figure 5B:
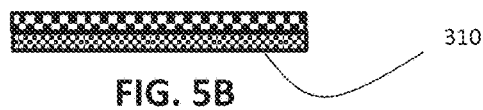
FIG. 5B is a cross sectional view of an anti-reflective coating comprising two distinct layers.

The exemplary steps of the manufacturing process are illustrated in FIGS. 4A-4I. An etch stop 304 is applied over an active region 302 on the insulating layer 301. A further oxide layer 340 may be applied and further processing steps performed to accommodate interconnects 309 to the active regions 302 and device outputs. The further processing includes forming a resistor 308 which provides the quench resistor. The resistor 308 may be provided as polycrystalline film of silicon which is formed by low pressure chemical vapour deposition which may be patterned and doped to create the resistor 308 which functions as a quench resistor. An optical window 307 is etched into a dielectric layer 342 down to the etch stop 304. The etch stop 304 is then removed. An anti-reflective material 310 may be coated over the insulating layer 301. FIG. 5A is a cross sectional view of an anti-reflective coating comprising three distinct layers. While FIG. 5B is a cross sectional view of an anti-reflective coating comprising two distinct layers. In the exemplary arrangement, the insulating layer 301 may be a silicon oxide layer which is formed by thermal oxidation. The oxide layer 340 may be a silicon oxide layer which is formed by plasma deposition.

The SiPM device comprises a trench which defines an optical window 307 which is registration with the active region 302. The optical pathway is formed by etching a trench into dielectric layer 342 down to the insulating layer 301. The active region may comprise a p-n or n-p diode. The diode includes a high-concentration shallow p or n doped silicon region and a low-concentration deep n or p doped silicon region. These doped regions are implanted through the insulating layer 301 using ion implantation. For example, for silicon, a typical p type implant is boron and a typical n-type implant is phosphorous.

The substrate region 303 may be highly doped for providing a low resistivity bulk region. The epitaxial layer 320 is a low doped, low defectivity, epitaxially grown silicon layer in which the Avalanche Photo diodes are formed. Beneath the active region 302 there is a P+Avalanche Photo Diode junction/Xenr zone 323 which is the PN junction with specific implanted dopants to create a Geiger Mode Avalanche Photo Detector. While the active region 302 has been described as being formed in the epitaxial layer, it is envisaged that the active region 302 may be formed directly on the surface of the substrate region 303 with the epitaxial layer 320 omitted.

Figure 6A:
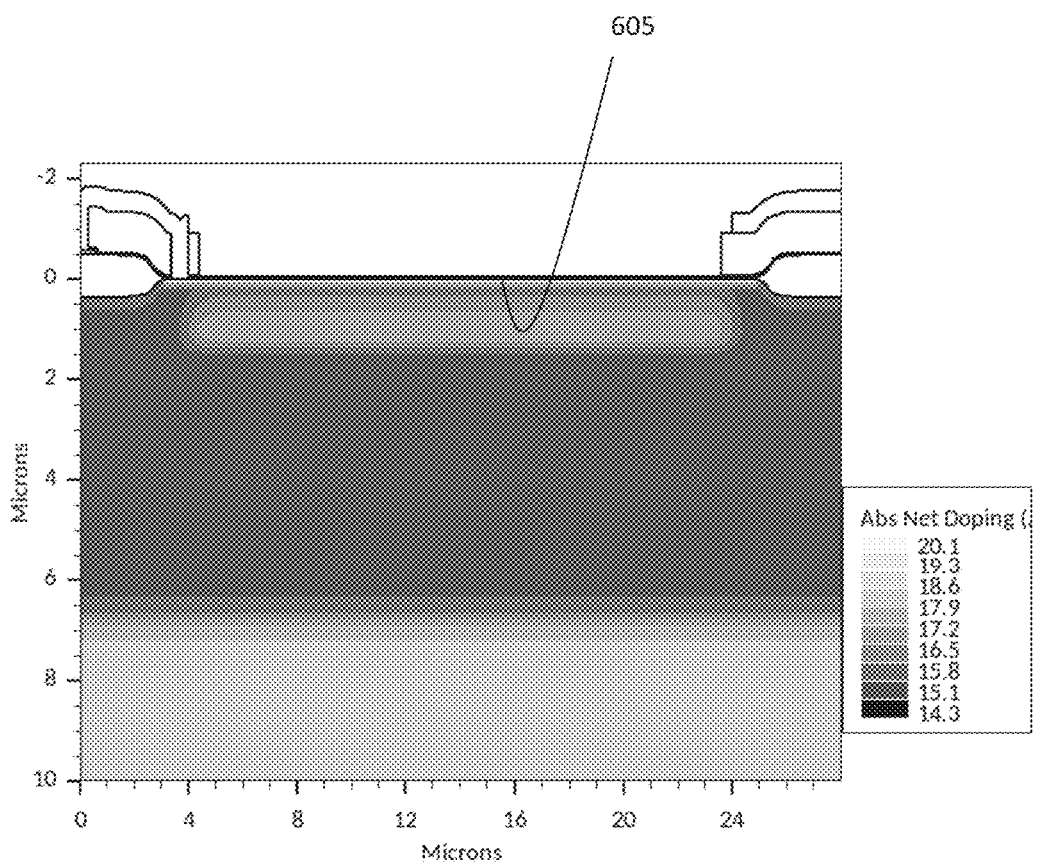
FIGS. 6A-6D are cross sectional views of an exemplary avalanche diode.
Figure 6B:
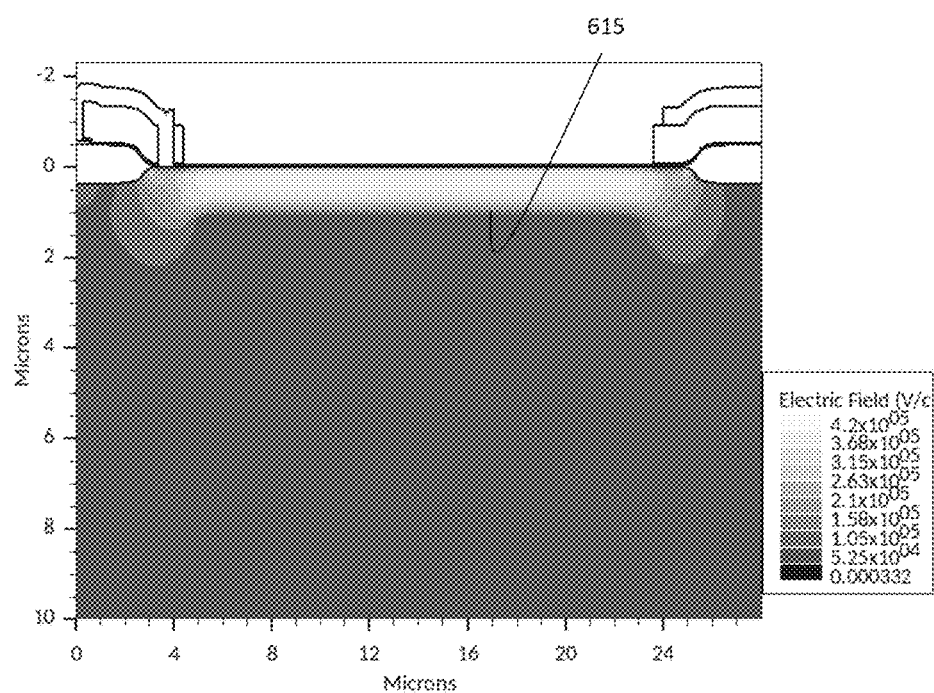
Figure 6C:
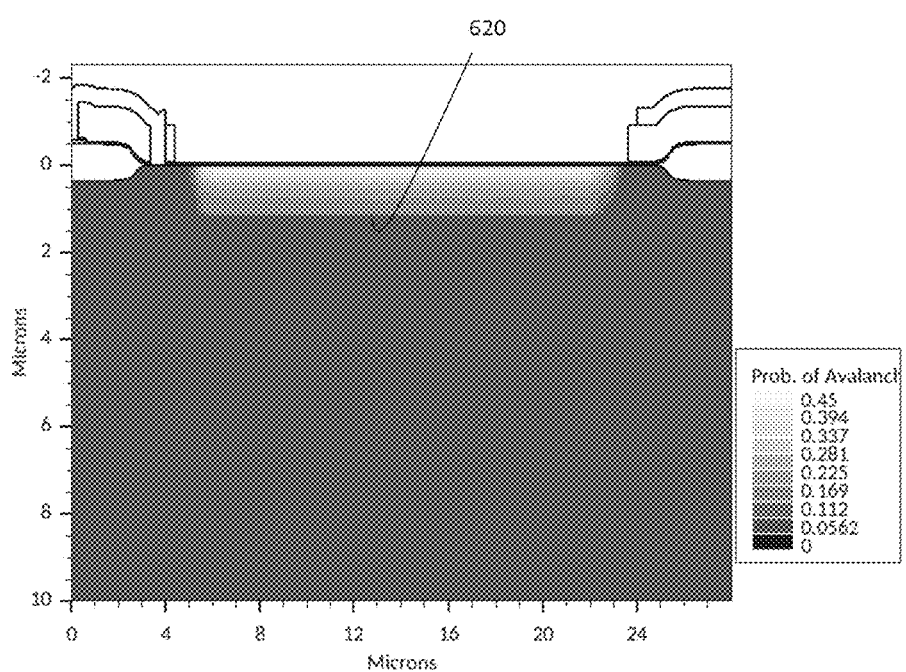
Figure 6D:
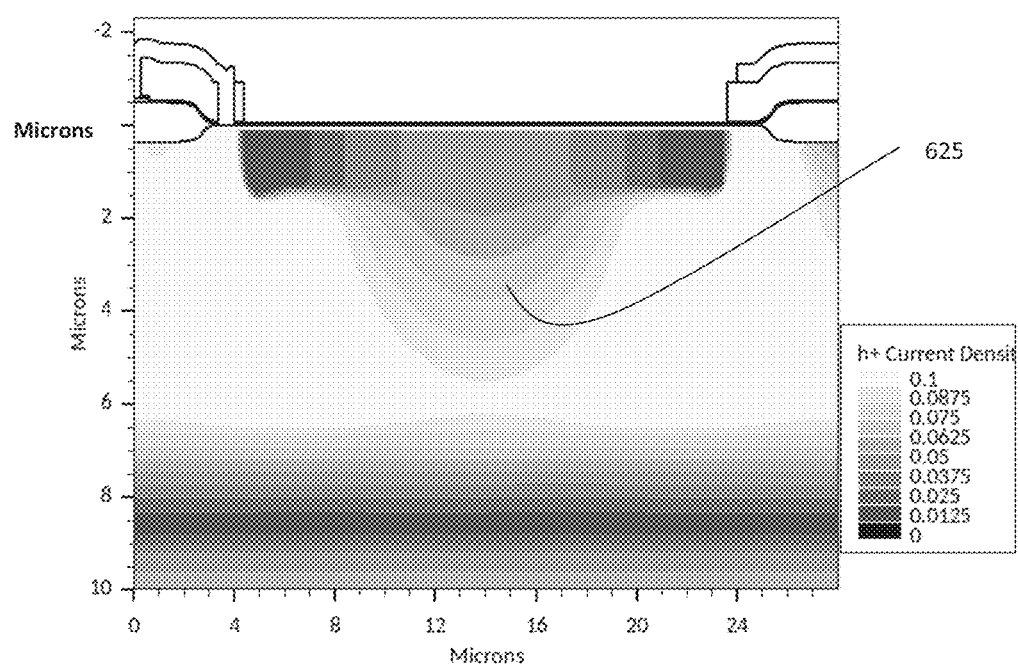

Referring now to FIGS. 6A-6D which shows a traditional avalanche diode 600 known heretofore, dopant is implanted in the active region 302 in a manner as previously described to form a dopant formation 605 in the active region 302. Traditionally, the dopant formation 605 defines a single continuous formation, i.e. a formation without gaps. A shallow dopant implant forms one of the anode and the cathode, and a deep implant forms the other one of the cathode and the anode. Traditionally, both the cathode and the anode are formed using implants that define continuous formations. FIG. 6A illustrates a cross-section of the absolute net doping in an avalanche diode, showing the shallow p-type implant layer forming the anode and a deep retrograde n-type implant enrichment (ENR) layer forming the cathode. In this cross-section there is no interruption in the ENR layer across the device. FIG. 6B illustrates the electric field 615 of the device shown in FIG. 6A. The electric field 615 is uniform across the active area where the ENR layer is defined. FIG. 6C illustrates the avalanche probability 620 of the device shown in FIG. 6A. The avalanche probability 620 is uniform across the active area where the ENR layer is defined. FIG. 6D illustrates hole current density 625, which is the minority carrier density, of the device shown in FIG. 6A, when in operation. The noise source due to after pulsing is modelled as a source of minority carriers generated in the epi layer below the active area of the device, between 6.5 μm and 8 μm beneath the silicon-oxide interface (defined as 0 μm). There is a strong increase in the hole carrier density at the middle of the active area, where there is also a significant avalanche probability. This is undesireable since minority carrier current cause spurious counts, known as the dark count, in the absence of light.

Figure 7:
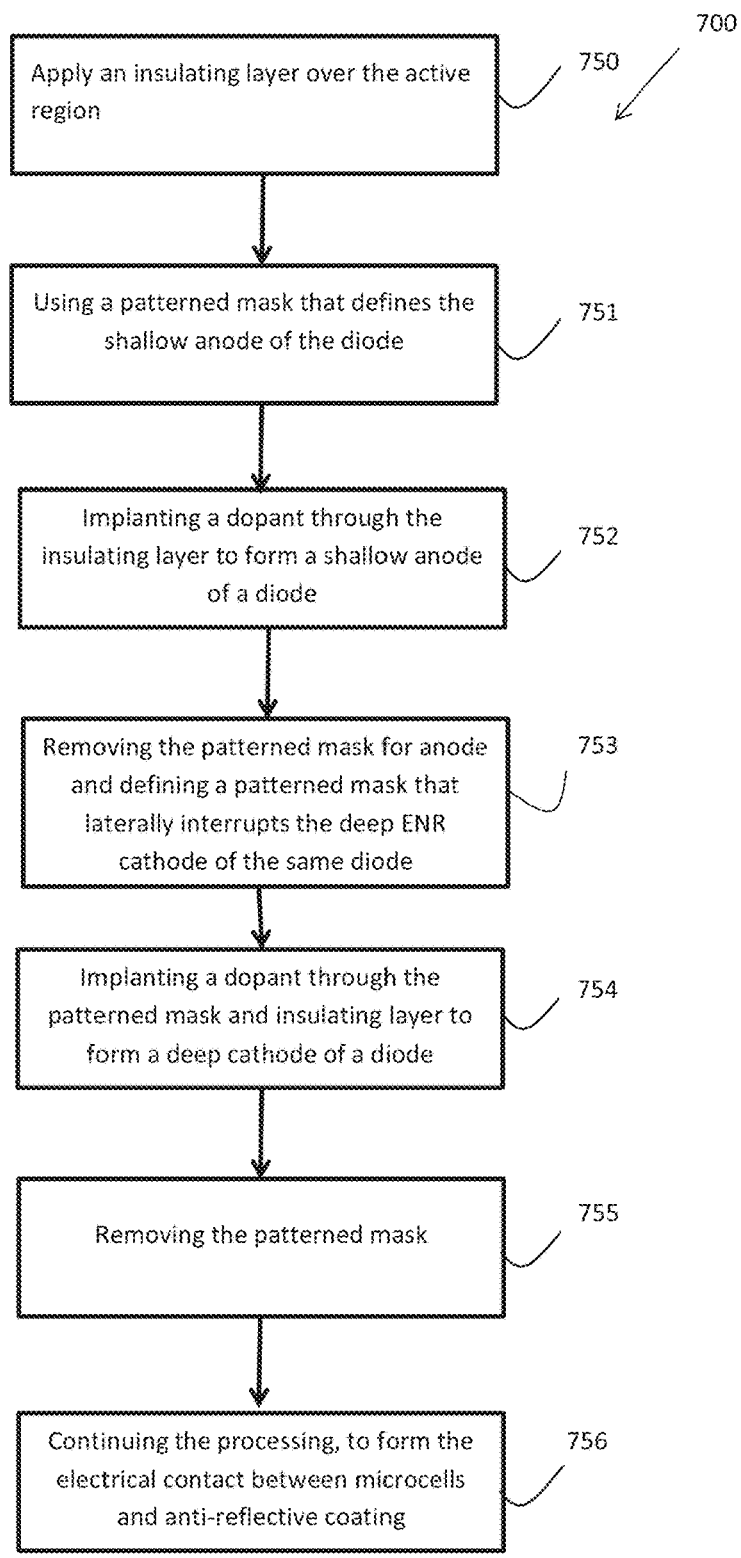
FIG. 7 is a flow chart illustrating exemplary steps for manufacturing an avalanche photodiode in accordance with the present teaching.

Referring to FIG. 7 is illustrated a flowchart 700 illustrating an exemplary method for manufacturing an avalanche photodiode in accordance with the present teaching. A insulating layer 301 is formed over an active region 302 of a substrate 319, step 750. Using a patterned mask to define a shallow anode of an avalanche diode, step 751. Implanting a dopant through the insulating layer to form a shallow anode of a diode, step 752. Removing the patterned mask for the anode and defining a patterned mask that laterally interrupts the deep ENR cathode, step 753. Implanting a dopant through the patterned mask and insulating layer to form a deep cathode of the avalanche diode, step 754. The implanted dopant which forms the cathode defines a discontinuous formation containing a plurality of spaced apart regions with an interruption/space provided between adjacent spaced apart regions. The patterned mask is then removed, step 755. Thus the discontinuous formation includes one or more gaps. Continuing the processing to form the electrical contact between microcells and the anti-reflective coating, step 756.

Referring now to FIGS. 8A-8D which shows an avalanche photodiode 800 in accordance with the present teaching, the avalanche photodiode 800 comprises a substrate 801 having an active area 802. A first dopant is implanted in the active area to forming one of an anode and the cathode of the avalanche photodiode 800; and a second dopant is implant in the active area 802 to forming the other one of the anode and the cathode of the avalanche photodiode 800. The first dopant implants defines a discontinuous formation 805A, 805B having at least one interruption 806. The discontinuous formation 805A and 805B may form the cathode. The second dopant implants defines a continuous formation which forms the anode. Depending on whether the avalanche photodiode 800 is a PNP diode or an NPN diode the cathode or anode may be formed by discontinuous implant and other one of the cathode or anode may be formed by the continuous implant and vice versa. The inventors envisage that both the cathode and the anode of the avalanche photodiode could be formed by a discontinuous implant.

In the exemplary embodiment, the avalanche photodiode 800 may be a single photon avalanche diode (SPAD) or a Geiger mode avalanche photodiode. The discontinuous formation comprises at least two regions 805A and 805B which are spatially separated from each other. The avalanche photodiode 800 further comprises one or more non-active regions 804. The interruption 806 defines a space between the at least two regions 805A and 805B which during operation of the avalanche photodiode 800 generates lateral electric fields 809 which forces minority carriers to the non-active regions 804 thereby reducing noise caused by minority carriers.

Figure 8A:
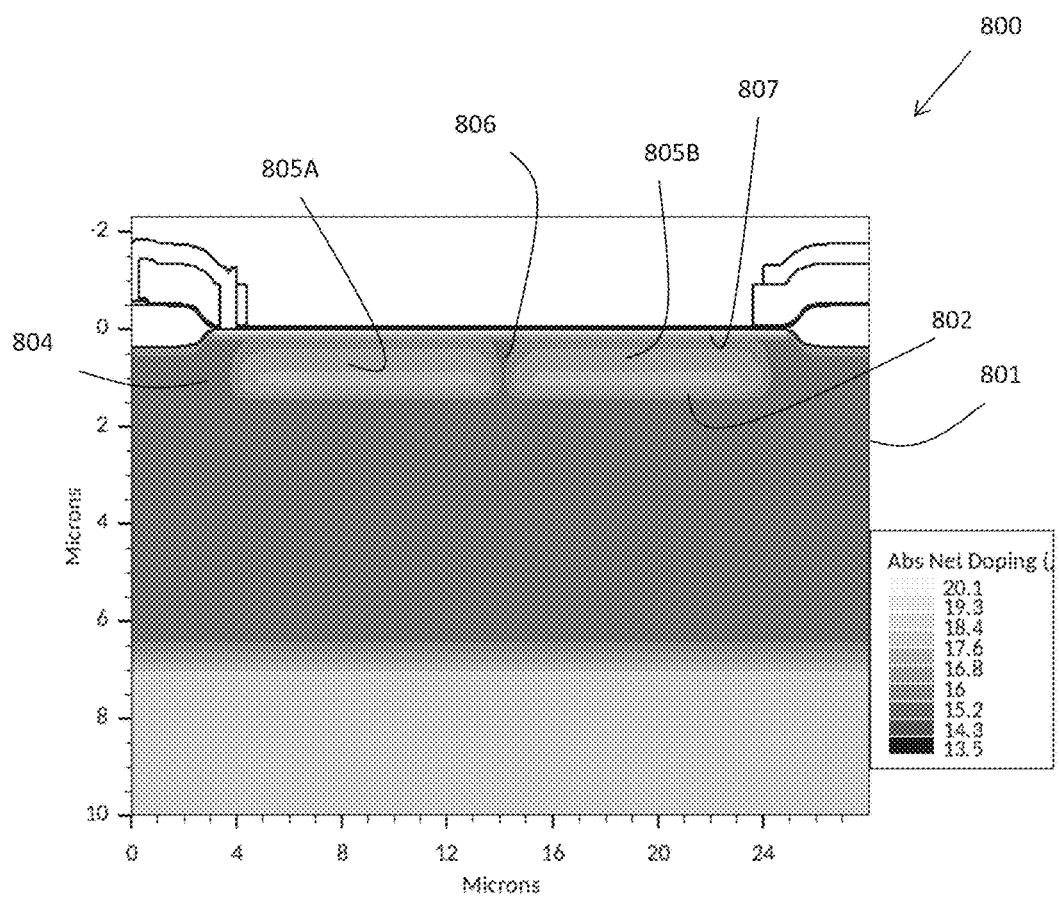
FIGS. 8A-8D are cross sectional views of an avalanche diode in accordance with the present teaching.

FIG. 8A illustrates a cross-section of the absolute net doping in an avalanche photodiode 800, showing the shallow p-type implant layer 807 forming the anode and a deep retrograde n-type implant enrichment (ENR) layer forming the cathode. In this cross-section there is an interruption 806 in the ENR layer across the device, at 14 microns from the micro-cell boundary. The location for the interruption of 14 microns from a micro-cell boundary is chosen because it divides the active area into two approximately 10 micron wide regions 805A and 805B, which is the optimal value to substantially reduce the noise in the device without incurring a large signal penalty. For larger structures such as 35 microns and 50 microns it is convenient to use three and four sub-divisions, respectively, which keep the configuration of approximately 10 micron wide sub-divisions. The optimum range of widths for the regions 805A and 805B is between 8 microns and 12 microns.

Figure 8B:
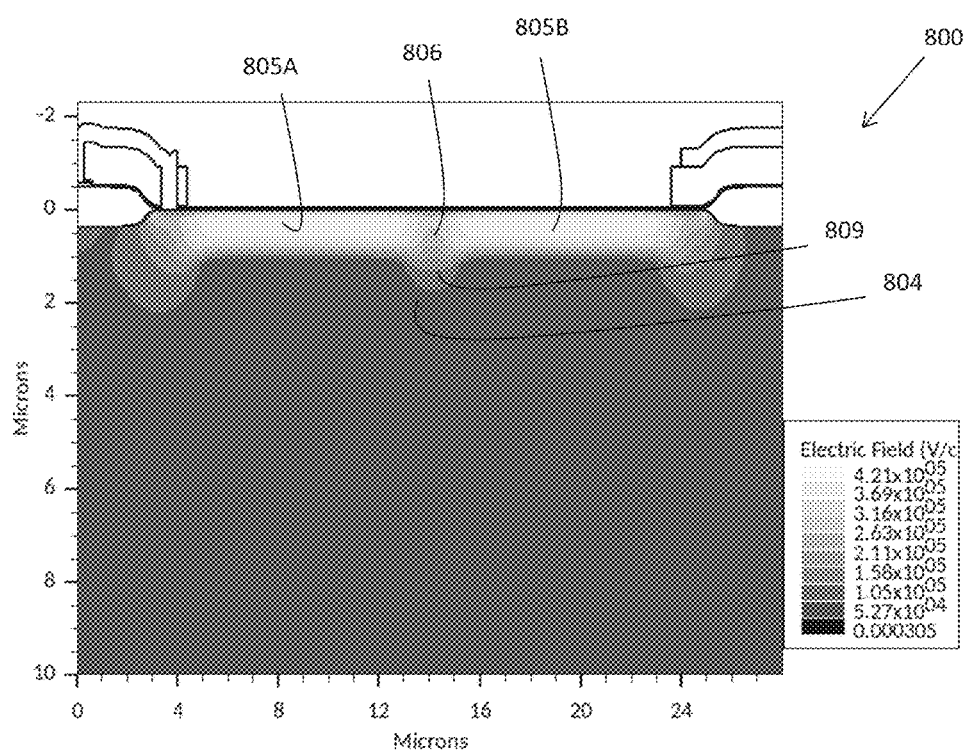
Figure 8C:
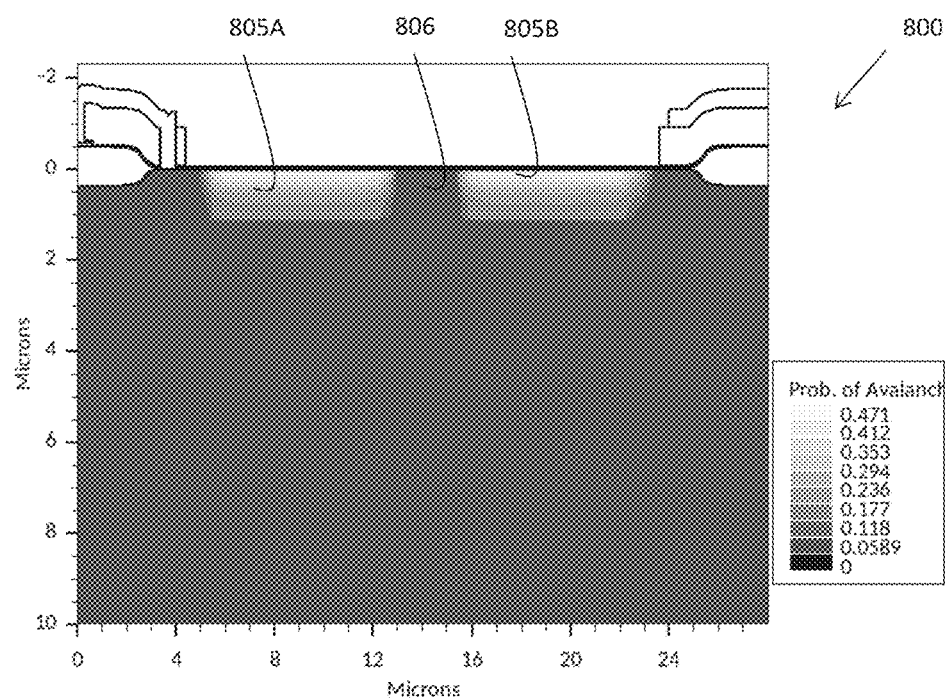
Figure 8D:
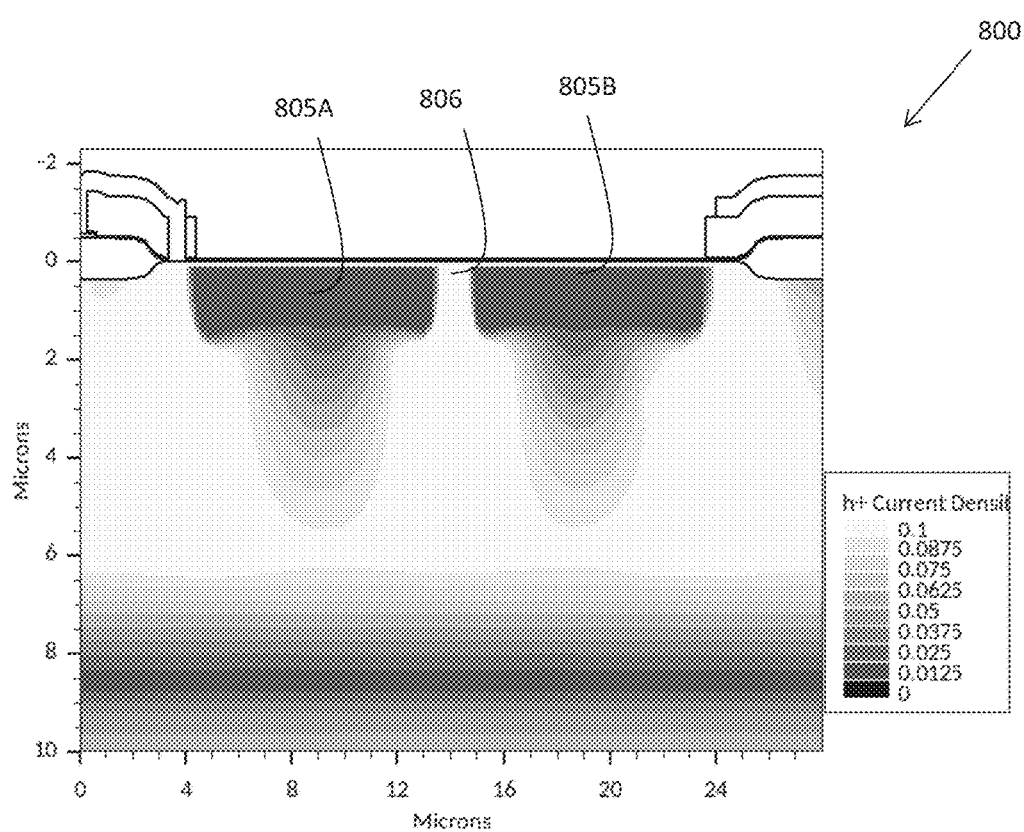

FIG. 8B illustrates the electric field of the device shown in FIG. 8A. The electric field is uniform across the active area where the ENR layer is defined, except where the interruption 806 of the ENR layer occurs at 14 microns from the micro-cell boundary. FIG. 8C illustrates the avalanche probability of the device shown in FIG. 8A. The avalanche probability is uniform across the active area where the ENR layer is defined, except where the interruption of the ENR layer occurs at 14 microns from the micro-cell boundary. FIG. 8D illustrates the hole current density, which is the minority carrier density, of the device shown in FIG. 8A, when in operation. The noise source due to after pulsing is modelled as a source of minority carriers generated in the epi layer below the active area of the device, between 6.5 μm and 8 μm beneath a silicon-oxide interface (defined as 0 μm). The hole carrier density at the middle of the active area which was present in the non-interrupted ENR design of FIG. 6D is now reduced. The interruption 806 between the two regions 805A and 805B generates lateral electric fields which forces the minority carriers to the non-active regions 804 thereby reducing noise caused by minority carriers.

Figure 9A:
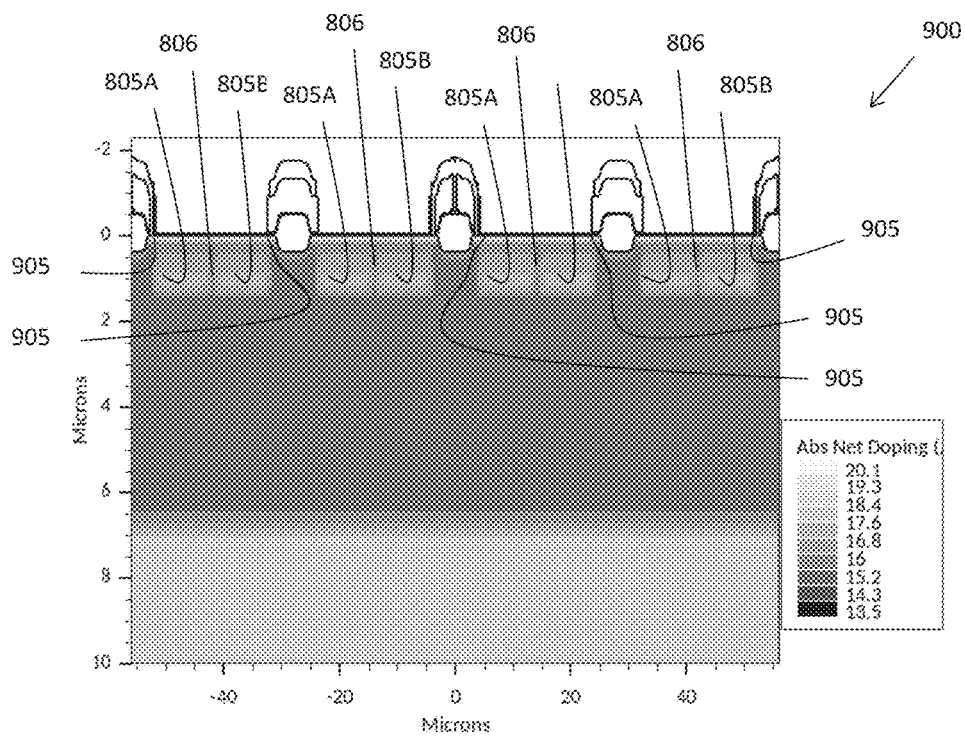
FIGS. 9A-9D are cross sectional views of an SiPM comprising an array of avalanche diode of FIG. 8A.

FIG. 9A illustrates an SiPM 900 comprising an array of avalanche photodiodes 800. The array of photodiodes 800 is formed on the subtrate in a matrix formation similar to that illustrated with reference to FIG. 1. The interruption 806 may be located at a distance in the range of 8 microns to 16 microns from a micro-cell boundary 905 of an adjacent micro-cell. In the exemplary embodiment, the interruption 806 is located at 14 microns from the micro-cell boundary. The optimal width of the interruption 806 between adjacent spaced apart regions 805A and 805B is determined by the depth of the implant and a dopant concentration of an epitaxial layer before the first and second dopant implants are implanted. The width of the interruption 806 is proportional to the depth of the implants. In one exemplary arrangement, the optimal width of the interruption between adjacent spaced apart regions is 1.4 μm for an implant depth of 800 nm and a dopant concentration of the epitaxial layer of between $10^{14}$ and $10^{15}$ atoms/cm$^3$ prior to the first and second dopant implants being implanted. In another example, the optimal width of the interruption between adjacent spaced apart regions is 2.8 μm for an implant depth of 1600 nm and a dopant concentration of the epitaxial layer of between $10^{14}$ and $10^{15}$ atoms/cm$^3$ prior to the first and second dopant implants being implanted. In a further example, the optimal width of the interruption between adjacent spaced apart regions is 4.2 μm for an implant depth of 2400 nm and a dopant concentration of the epitaxial layer of between $10^{14}$ and $10^{15}$ atoms/cm$^3$ prior to the first and second dopant implants being implanted. A space at a border 905 of a micro-cell boundary also generates lateral electric fields which forces minority carriers to the non-active regions thereby reducing noise caused by minority carriers.

Figure 9B:
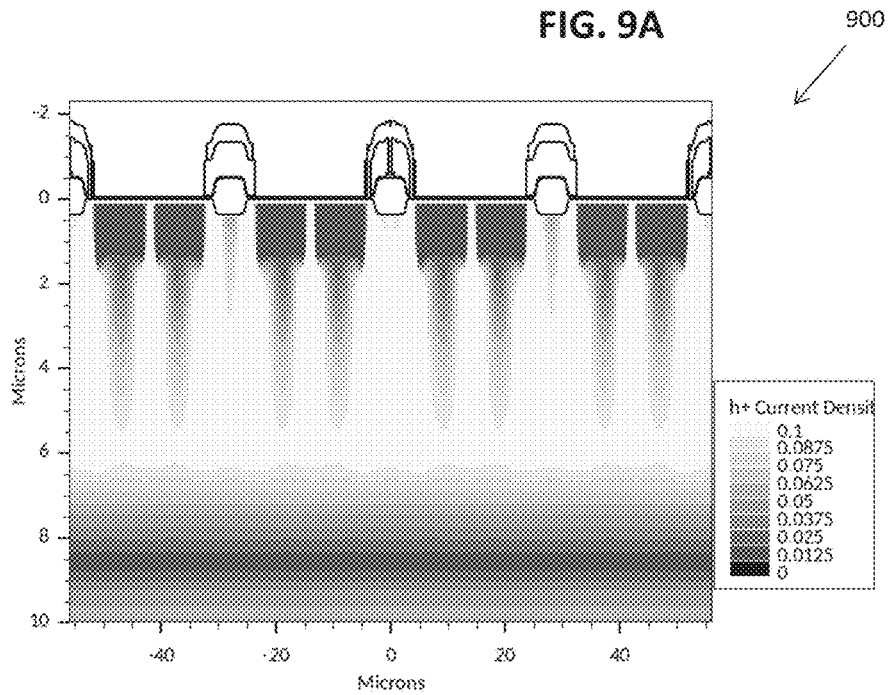
Figure 9C:
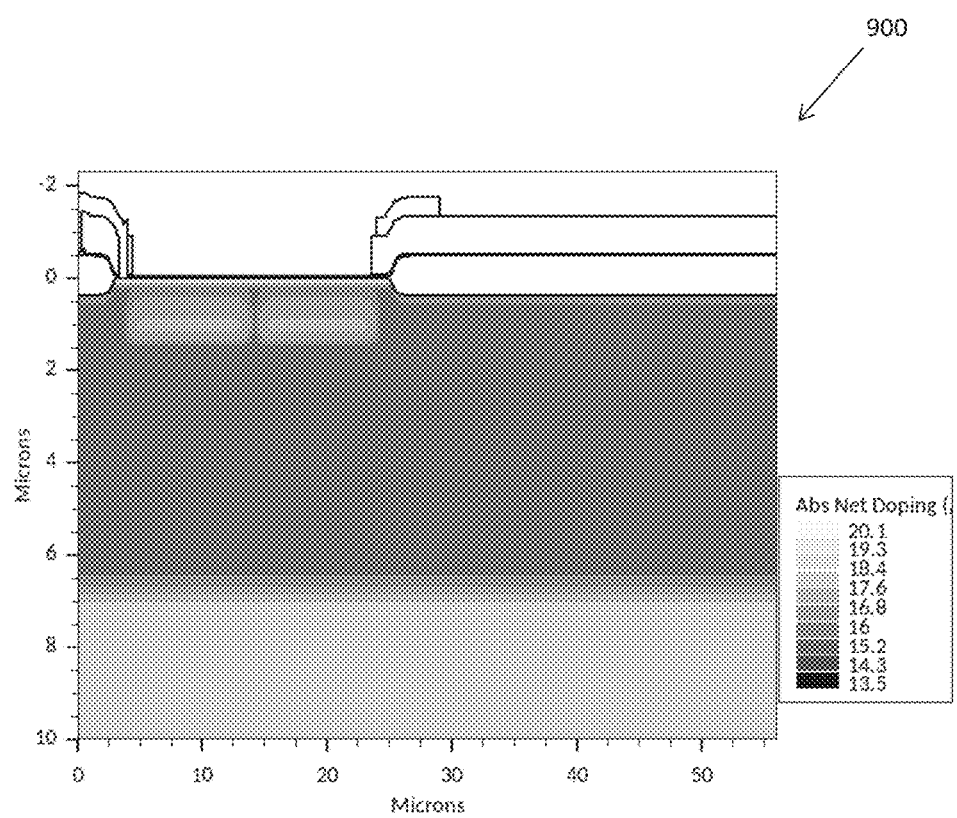
Figure 9D:
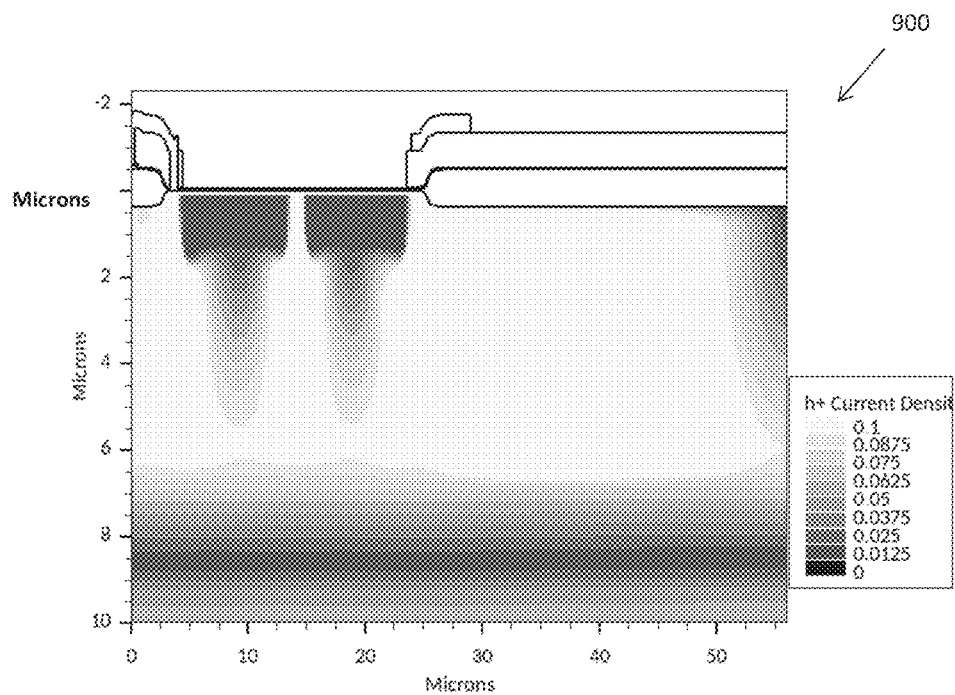

FIGS. 9B and 9C demonstrate the effect of multiple microcells, and how the space/interruption between the microcells functions in the same way as the interruption between the spaced apart region 805A and 805B by removing the hole current from the active area that would otherwise increase the noise in the device. FIGS. 9B and 9C demonstrate the effect of the edge of the microcell array and how this space functions in the same way as the interruption 806 as previously described by removing the hole current from the active area that would otherwise increase the noise in the device.

TABLE 1

|  | 'A' structure (with cage) | 'B' structure (no cage) | Relative reduction |
| --- | --- | --- | --- |
| 20 µm cell design | 2.9% | 15.3% | 81% |
| 35 µm cell design | 6.5% | 39.5% | 83% |

The table 1 shows the calculated hole current contribution that reaches the active area of the device, defined as the location in the device where there is a non-zero avalanche probability, for different designs shown in FIG. 8 and FIG. 6 ('A' and 'B' structures, respectively). In the case where there is a continuous ENR ('B' structure) there is a significant increase in the contribution of hole carriers, the minority carrier of the n-type material, compared with the case where there is an interruption of the ENR ('A' structure). This reduction of minority carrier contribution to the noise is 81% and 83% in the 20 µm and 35 µm microcell designs, respectively.

Figure 10A:
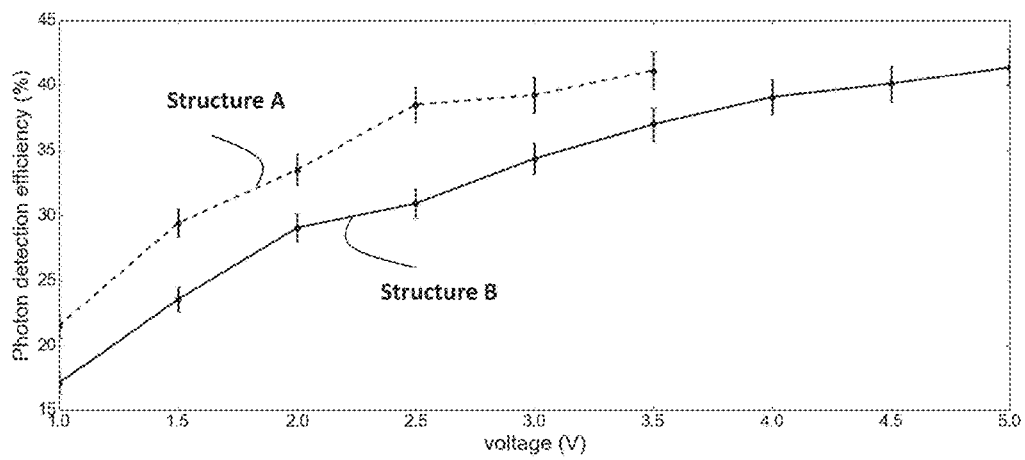
FIG. 10A show the effect on an output signal in terms of the Photon Detection Efficiency.
Figure 10B:
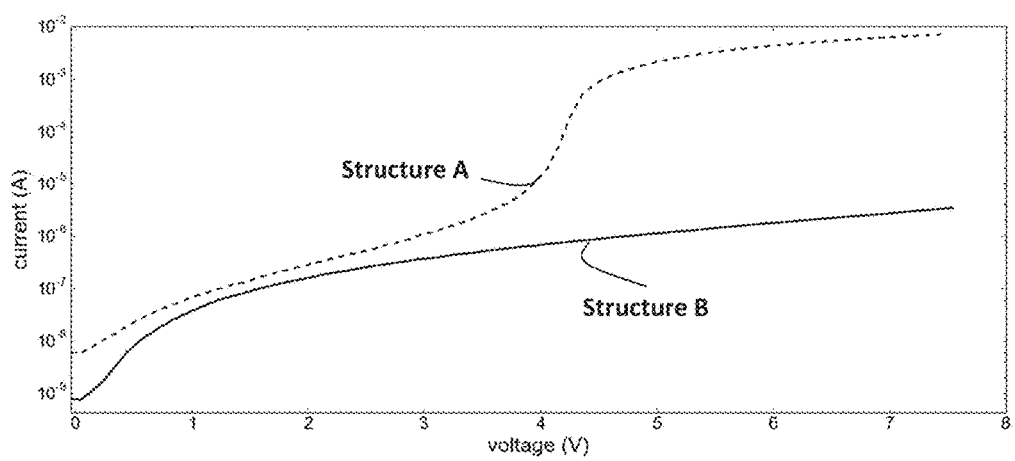
FIG. 10B shows the effect on the current in terms of the dark current of the SiPM with and without the interrupted structure.

Referring now to FIGS. 10A and 10B, FIG. 10A shows the effect on the signal in terms of the Photon Detection Efficiency. FIG. 10B shows the current in terms of the dark current of the SiPM with and without the interrupted structure. The effect of the interrupted structure on the signal is a reduction of approximately 3% detection efficiency at the same overvoltage. A higher voltage operation is possible with the interrupted structure than with the non-interrupted structure. The effect of the interrupted structure on the noise is a more ten-fold decrease in the dark current at an over-voltage of 3.5V or higher.

Figure 11A:
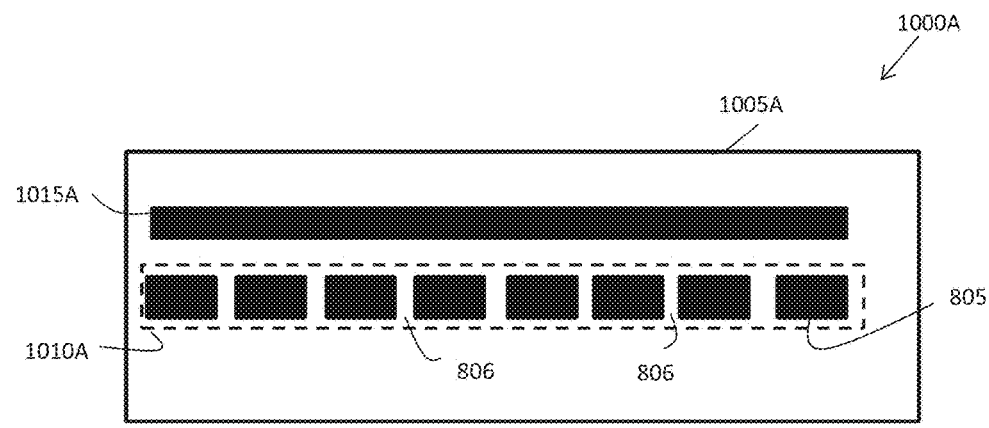
FIGS. 11A-11C are exemplary avalanche photodiodes in accordance with the present teaching.

FIG. 11A illustrates an exemplary avalanche photodiode 1000A which is in accordance with the present teaching. A deep dopant implant forms a discontinuous formation in the active region 1005A which forms the cathode 1010A. In this example, the discontinuous formation contains eight spaced apart regions 805. However, it is not intended to limit the present teaching to eight regions as the inventors envisage that the discontinuous formation may contain between two and eight regions or more if desired. A shallow dopant implant forms the anode 1015A. The deep implant may have a depth of between 500 nm and 8 microns. The deep implant may be a retrograde implant but is is not intended to limit the present teaching to retrograde implants as any suitable implanting technique may be used. The shallow dopant implant may have a depth of between 10 nm and less than 500 nm.

Figure 11B:
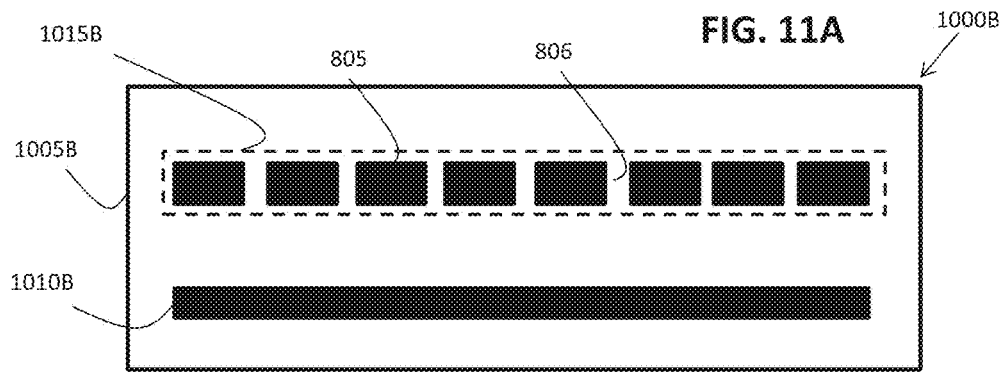
Figure 11C:
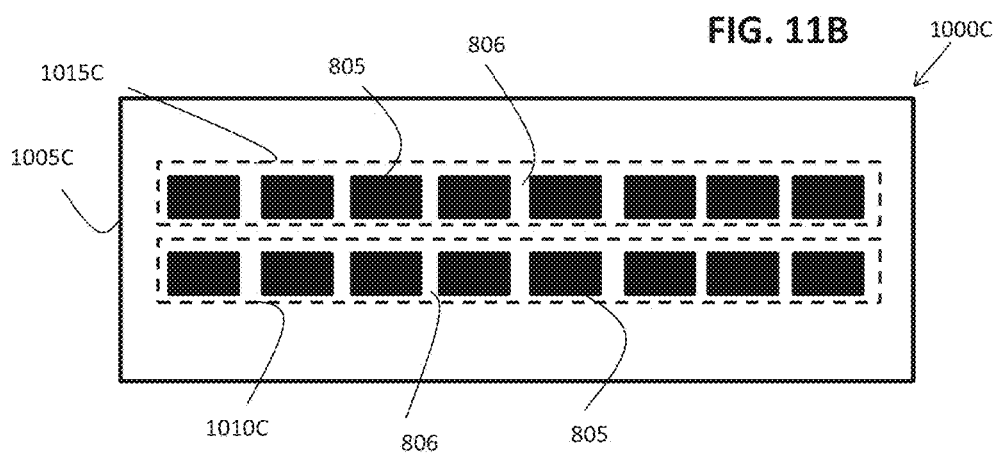

FIG. 11B illustrates another exemplary avalanche photodiode 1000B which is in accordance with the present teaching. A shallow dopant implant forms a discontinuous formation in the active region 100BA which forms the anode 1015B. A deep dopant implant forms a continuous formation which forms the cathode 1010B. FIG. 11C illustrates another exemplary avalanche photodiode 1000C which is also in accordance with the present teaching. In this example both the shallow implant and the deep implant defines a discontinuous formation. The anode 1015C and the cathode 1010C of the avalanche photodiode 1000C each contain a plurality of spaced apart regions 805 with an interruption 806 located between adjacent pairs of regions 805. The substrate may be an n-type substrate or a p-type substrate. An insulating layer may be provided on the substrate through which the first and second dopants are implanted. An epitaxial layer may be provided intermediate the insulating layer and the substrate in a similar manner as described with reference to FIGS. 4A-4J. The insulating layer may be formed directly on the epitaxial layer. The epitaxial layer may comprise a PN junction. The substrate may be highly doped for providing a low resistivity bulk region. The insulating layer may comprise an oxide material. An anti-reflective coating may be provided on the insulating layer. An optical pathway may be provided for facilitating the transmission of light to the active region through the insulating layer. The optical pathway may be formed by etching a trench into a dielectric layer. A quench resistor may be operably coupled to the avalanche diodes. One of the first dopant implant and the second dopant implant is a P type material, and the other one of the first dopant implant and the second dopant implant is an N type material. The insulating layer may have a thickness in the range of 10 nm to 50 nm. The insulating layer may comprise silicon nitride. The anti-reflective coating may comprises silicon oxide. The anti-reflective coating may have a thickness in the range of 10 nm to 50 nm. The anti-reflective coating may comprises SiO with a thickness of 36 nm and SiN with a thickness in the range of 10 nm-45 nm.

It will be appreciated by the person of skill in the art that various modifications may be made to the above described embodiments without departing from the scope of the present invention. In this way it will be understood that the teaching is to be limited only insofar as is deemed necessary in the light of the appended claims. The term semiconductor photomultiplier is intended to cover any solid state photomultiplier device such as Silicon Photomultiplier [SiPM], MicroPixel Photon Counters [MPPC], MicroPixel Avalanche Photodiodes [MAPD] but not limited to.

Similarly the words comprises/comprising when used in the specification are used to specify the presence of stated features, integers, steps or components but do not preclude the presence or addition of one or more additional features, integers, steps, components or groups thereof.

What is claimed is:
1. An avalanche photodiode comprising;
    a substrate having an active area;
    a first dopant implant in the active area forming one of an anode and the cathode of the avalanche photodiode; and
    a second dopant implant in the active area forming the other one of the anode and the cathode of the avalanche photodiode, wherein at least one of the first and second dopant implants defines a discontinuous formation comprising at least two regions which are spatially separated from each other with no implanted structure located in the space therebetween; wherein a lateral electric field extends from the space between the at least two regions which forces minority carriers away from the space to a non-active region thereby reducing noise caused by minority carriers.
2. An avalanche photodiode as claimed in claim 1, wherein the other one of the first and second dopant implants defines a continuous formation.
3. An avalanche photodiode as claimed in claim 1, where the avalanche photodiode is a single photon avalanche diode (SPAD) or a Geiger mode avalanche photodiode.
4. An avalanche photodiode as claimed in claim 1; wherein a space at a border of a micro-cell boundary containing an array of avalanche photodiodes generates lateral electric fields which forces minority carriers to the non-active regions thereby reducing noise caused by minority carriers.

5. An avalanche photodiode as claimed in claim 1; wherein the discontinuous formation in the active region in use generates lateral electric fields which forces minority carriers to the non-active regions thereby reducing noise caused by minority carriers.

6. An avalanche photodiode as claimed in claim 1, wherein the at least two regions together form either the cathode or the anode of the avalanche diode.

7. An avalanche photodiode as claimed in claim 6, wherein the at least two regions are formed by a deep implant.

8. An avalanche photodiode as claimed in claim 7; wherein the deep implant has a depth of between 500 nm and 8 microns.

9. An avalanche photodiode as claimed in claim 8; wherein the deep implant is a retrograde implant.

10. An avalanche photodiode as claimed in claim 8, wherein one of the first and second dopant implant that defines the continuous formation is formed by a shallow dopant implant.

11. An avalanche photodiode as claimed in claim 8; wherein the shallow dopant implant has a depth of between 10 nm and less than 500 nm.

12. An avalanche photodiode as claimed in claim 1, wherein the width of each region is in the range of 8 microns to 12 microns.

13. An avalanche photodiode as claimed in claim 12, wherein the width of each region is approximately 10 microns.

14. An avalanche photodiode as claimed in claim 1, wherein the interruption is provided between each spaced apart region.

15. An avalanche photodiode as claimed in claim 14, wherein the interruption is located at a distance in the range of 8 microns to 16 microns from a micro-cell boundary.

16. An avalanche photodiode as claimed in claim 15, wherein the interruption is located at 14 microns from the micro-cell boundary.

17. An avalanche photodiode as claimed in claim 1, wherein the number of spaced apart regions used to form one of the cathode and the anode of the avalanche photodiode is in the range of between 2 to 8 regions.

18. An avalanche photodiode as claimed in claim 17, wherein three spaced apart regions are provided.

19. An avalanche photodiode as claimed in claim 17, wherein four spaced apart regions are provided.

20. An avalanche photodiode as claimed in claim 14, wherein an optimal width of the interruption between adjacent spaced apart regions is determined by the depth of the implant and a dopant concentration of an epitaxial layer before the first and second dopant implants are implanted.

21. An avalanche photodiode as claimed in claim 20, wherein the width of the interruption is proportional to the depth of the implant.

22. An avalanche photodiode as claimed in claim 21, wherein the optimal width of the interruption between adjacent spaced apart regions is 1.4 μm for an implant depth of 800 nm and a dopant concentration of the epitaxial layer of between $10^{14}$ and $10^{15}$ atoms/cm$^3$ prior to the first and second dopant implants being implanted.

23. An avalanche photodiode as claimed in claim 21, wherein the optimal width of the interruption between adjacent spaced apart regions is 2.8 μm for an implant depth of 1600 nm and a dopant concentration of the epitaxial layer of between $10^{14}$ and $10^{15}$ atoms/cm$^3$ prior to the first and second dopant implants being implanted.

24. An avalanche photodiode as claimed in claim 21, wherein the optimal width of the interruption between adjacent spaced apart regions is 4.2 μm for an implant depth of 2400 nm and a dopant concentration of the epitaxial layer of between $10^{14}$ and $10^{15}$ atoms/cm$^3$ prior to the first and second dopant implants being implanted.

25. An avalanche photodiode as claimed in claim 1; wherein the substrate is one of an n-type substrate and a p-type substrate.

26. An avalanche photodiode as claimed in claim 1; further comprising an insulating layer through which the first and second dopants are implanted.

27. An avalanche photodiode of claim 23, further comprising an epitaxial layer provided intermediate the insulating layer and the substrate.

28. An avalanche photodiode of claim 27, wherein the insulating layer is formed directly on the epitaxial layer.

29. An avalanche photodiode of claim 27, wherein the epitaxial layer comprises a PN junction.

30. An avalanche photodiode of claim 1, wherein the substrate is highly doped for providing a low resistivity bulk region.

31. An avalanche photodiode of claim 27, wherein the insulating layer comprises an oxide material.

32. An avalanche photodiode of claim 27, further comprising an anti-reflective coating provided on the insulating layer.

33. An avalanche photodiode of claim 27, wherein an optical pathway is provided for facilitating the transmission of light to the active region through the insulating layer.

34. An avalanche photodiode of claim 33, wherein the optical pathway is formed by etching a trench into a dielectric layer.

35. An avalanche photodiode of claim 1, wherein a quench resistor is operably coupled thereto.

36. An avalanche photodiode of claim 1, wherein one of the first dopant implant and the second dopant implant is a P type material, and the other one of the first dopant implant and the second dopant implant is an N type material.

37. An avalanche photodiode of claim 27, wherein the insulating layer has a thickness in the range of 10 nm to 50 nm.

38. An avalanche photodiode of claim 27, wherein the insulating layer comprises silicon nitride.

39. An avalanche photodiode of claim 32, wherein the anti-reflective coating comprises silicon oxide.

40. An avalanche photodiode of claim 32; wherein the anti-reflective coating has a thickness in the range of 10 nm to 50 nm.

41. An avalanche photodiode of claim 39, wherein the anti-reflective coating comprises SiO with a thickness of 36 nm and SiN with a thickness in the range of 10 nm-45 nm.

42. A semiconductor photomultiplier comprising a plurality of avalanche photodiodes as claimed in claim 1.

* * * * *

UNITED STATES PATENT AND TRADEMARK OFFICE
CERTIFICATE OF CORRECTION

PATENT NO. : 10,043,936 B1
APPLICATION NO. : 15/336368
DATED : August 7, 2018
INVENTOR(S) : Kevin Michael O'Neill, John Carlton Jackson and Liam Wall It is certified that error appears in the above-identified patent and that said Letters Patent is hereby corrected as shown below:

On the Title Page

Item [73] "SEMICONDUCTOR COMPONENTS INDUSTRIES, LLC., Phoenix, AZ, (US)"
should read -- SensL Technologies Ltd., County Cork, (IE) --.

Signed and Sealed this
Eighteenth Day of September, 2018

Andrei Iancu
*Director of the United States Patent and Trademark Office*